(12) United States Patent
Mai et al.

(10) Patent No.: US 7,551,012 B2
(45) Date of Patent: Jun. 23, 2009

(54) PHASE SHIFTING IN DLL/PLL

(75) Inventors: Huy Tuong Mai, Kanata (CA); Bruce Millar, Stittsville (CA)

(73) Assignee: Mosaid Technologies Incorporated, Kanata, Ontario (CA)

( * ) Notice: Subject to any disclaimer, the term of this patent is extended or adjusted under 35 U.S.C. 154(b) by 0 days.

(21) Appl. No.: 11/691,849

(22) Filed: Mar. 27, 2007

(65) Prior Publication Data
US 2008/0238534 A1 Oct. 2, 2008

(51) Int. Cl.
*H03L 7/06* (2006.01)
(52) U.S. Cl. ..................................... 327/158
(58) Field of Classification Search ................ 327/147, 327/148, 156, 157
See application file for complete search history.

(56) References Cited

U.S. PATENT DOCUMENTS

| | | | |
|---|---|---|---|
| 4,792,705 A | 12/1988 | Ouyang et al. |
| 5,233,314 A | 8/1993 | McDermott et al. |
| 5,473,283 A | 12/1995 | Luich |
| 5,734,279 A | 3/1998 | Bereza |
| 6,271,729 B2 | 8/2001 | Sung et al. |
| 6,304,116 B1 | 10/2001 | Yoon et al. |
| 6,310,498 B1 | 10/2001 | Larsson |
| 6,407,601 B1 | 6/2002 | Lin |
| 6,472,914 B1 | 10/2002 | Gu et al. |
| 6,483,389 B1 | 11/2002 | Lamb |
| 6,525,684 B2 | 2/2003 | Tsujikawa |
| 6,603,340 B2 | 8/2003 | Tachimori |
| 6,617,936 B2 | 9/2003 | Dally et al. |
| 6,621,312 B2 | 9/2003 | Tang et al. |
| 6,667,641 B1 | 12/2003 | Wang et al. |
| 6,717,446 B1 | 4/2004 | Vu |
| 6,724,265 B2 | 4/2004 | Humphreys |
| 6,741,110 B2 | 5/2004 | Roisen |
| 6,744,292 B2 | 6/2004 | Chen et al. |
| 6,774,689 B1 | 8/2004 | Sudjian |
| 6,861,916 B2 | 3/2005 | Dally et al. |
| 6,876,240 B2 | 4/2005 | Moon et al. |
| 6,897,690 B2 * | 5/2005 | Keaveney et al. ........... 327/148 |
| 6,906,565 B2 * | 6/2005 | Keaveney ................... 327/147 |
| 6,924,992 B2 | 8/2005 | Gaudin et al. |

(Continued)

OTHER PUBLICATIONS

Phase-Locked Loops: "Design, Simulation, and Applications, 4th Edition", Best, Roland E., McGraw-Hill, 1999, pp. 92-102.

(Continued)

*Primary Examiner*—Jeffrey S Zweizig
(74) *Attorney, Agent, or Firm*—Shin Hung; Borden Ladner Gervais LLP

(57) ABSTRACT

The disclosure relates to phase shifting in Delay Locked Loops (DLLs) and Phase-Locked Loops (PLLs). A charge pump in the DLL or PLL includes a capacitor connected in parallel to an output node. A primary current switching circuit charges the capacitor with a source current and discharges the capacitor with a sink current. A supplemental source circuit sources a positive phase shift producing current which has a range of magnitudes. A magnitude of the positive phase shift producing current is determined by at least one source selection signal. A supplemental sink circuit for sources a negative phase shift producing current which has a range of magnitudes. A magnitude of the negative phase shift producing current is determined by at least one sink selection signal.

18 Claims, 10 Drawing Sheets

U.S. PATENT DOCUMENTS

| | | | |
|---|---|---|---|
| 6,952,462 B2 | 10/2005 | Harrison | |
| 6,954,511 B2 | 10/2005 | Tachimori | |
| 6,958,636 B2 * | 10/2005 | Boerstler et al. | 327/156 |
| 6,975,840 B2 | 12/2005 | Lin | |
| 6,995,607 B2 * | 2/2006 | Dosho et al. | 327/558 |
| 7,092,689 B1 | 8/2006 | Boecker et al. | |
| 7,271,621 B2 | 9/2007 | Metz | |
| 7,443,250 B2 | 10/2008 | Seethamraju et al. | |
| 2002/0041196 A1 | 4/2002 | Demone et al. | |
| 2004/0057546 A1 | 3/2004 | Badets et al. | |
| 2004/0085106 A1 | 5/2004 | Jeong | |

OTHER PUBLICATIONS

U.S. Appl. No. 12/193,077 Office Action dated Dec. 17, 2008.

* cited by examiner

PHASE SHIFTING IN DLL/PLL

FIELD OF THE INVENTION

The present invention relates generally to charge pump circuits.

BACKGROUND OF THE DISCLOSURE

As will be appreciated by those skilled in the art, a charge pump can be characterized as a circuit that uses capacitors to create either a higher or lower voltage. Charge pumps are used in a variety of different applications such as, for example, applications involving Delay Locked Loops (DLLs) and Phase-Locked Loops (PLLs).

With respect to PLLs, a charge pump can be used to provide a control voltage applied to a Voltage Controlled Oscillator (VCO). Typically, a PLL includes a phase detector, a loop filter coupled to the output of the charge pump, an amplifier, and a VCO interconnected in a known manner to form a feedback system. The charge pump converts logic level pulses generated by the phase detector into current pulses which are fed to the loop filter. The loop filter integrates the current pulses to produce a control voltage for the VCO.

With respect to DLLs, a charge pump can be used to provide a control voltage for a Voltage Control Delay Line (VCDL) of the DLL. As will be appreciated by those skilled in the art, in certain types of devices (for example, DRAM devices) a DLL can be used to change the phase of a clock signal. In this regard, a DLL includes a delay chain composed of number of delay gates connected in series (in a daisy chain manner).

Thus the charge pump is an important component in PLLs and DLLs, and many issued patent are directed towards them. One such patent is U.S. Pat. No. 7,092,689 of Boecker et al. which discloses a charge pump including a first array of mirror devices for producing, within the charge pump, a positive delta current, and a second array of mirror devices for producing, within the charge pump, a different delta current. Each mirror device in either of the arrays has current mirrored into it from a different reference current source, and the phase shift producing currents generated by the arrays do not track the charge pump current. As a result, trying to calculate the effects of the arrays under actual operating conditions based upon the conditions existing at testing/calibration time is difficult.

Accordingly, it would be advantageous to improve upon charge pump circuits that facilitate phase shifting in a DLL or PLL.

SUMMARY

According to one example embodiment, there is a method for charging and discharging a capacitance in a feedback system. The feedback system includes a charge pump in electrical communication with the capacitance. The charge pump has a source portion and a sink portion. The method includes the step of generating a source current from the source portion when a charge up control signal is at an active logic level. The source current charges the capacitance. The method also includes the step of generating a sink current from the sink portion when a charge down control signal is at an active logic level. The sink current discharges the capacitance. The method also includes the step of carrying out fine-tune phase shifting by generating at least one offset current in at least a selected one of the source and sink portions. The offset current tracks the charge pump current and is generated irrespective of either of the control signals.

According to another example embodiment, there is a charge pump circuit that includes a capacitor connected in parallel to an output node. A reference current source generates a reference current. A primary current switching circuit charges the capacitor with a source current and discharges the capacitor with a sink current. The source current tracks the reference current and the sink current tracks the reference current. A supplemental source circuit sources a positive phase shift producing current which has a range of magnitudes. A magnitude of the positive phase shift producing current is determined by at least one source selection signal. The positive phase shift producing current tracks the same current tracked by the source current. A supplemental sink circuit for sources a negative phase shift producing current which has a range of magnitudes. A magnitude of the negative phase shift producing current is determined by at least one sink selection signal. The negative phase shift producing current tracks the same current tracked by the sink current.

According to another example embodiment, there is a method for providing charge up and charge down control signals having active and inactive logic levels to a charge pump in a delay-locked loop. The charge pump charging a capacitance in response to the active logic level of the charge up signal, and discharging the capacitance in response to the active logic level of the charge down signal. In response to detection of a first edge of a reference clock signal, there is a change of logic levels of the charge down signal from the inactive logic level of the charge down signal to the active logic level of the charge down signal. In response to detection of an edge of a feedback clock signal falling within less than 180 degrees from the first edge, there is a change of logic levels of the charge up signal from the inactive logic level of the charge up signal to the active logic level of the charge up signal, and there is a change of logic levels of the charge down signal from the active logic level of the charge down signal to the inactive logic level of the charge down signal. In response to detection that an edge of an additional reference signal at a point in time about midway between the first edge and a subsequent edge of the reference clock signal has past, changing the active logic level of the charge up signal to the inactive logic level, while maintaining the charge down signal at the inactive logic level.

Expediently, charging and discharging can, in some examples, be disabled during a period of time between the midway point in time and the subsequent edge of the reference clock signal.

Conveniently, the additional reference signal can, in some example, be 180 degrees phase shifted relative to the reference clock signal.

According to another example embodiment, there is a delay-locked loop that includes a voltage control delay line for receiving a reference clock signal and for delaying the reference clock signal to provide a feedback clock signal. A phase detector for receiving the reference clock signal and the feedback clock signal. The phase detector generating charge up and charge down control signals dependent upon a phase difference between the reference clock signal and the feedback clock signal. A loop filter includes a capacitor for providing a variable bias voltage for selecting a delay to be added to the reference clock signal by the voltage control delay line. A charge pump includes at least two switching transistors. One of the switching transistors permits current to be added into the capacitor when switched on in response to the charge up signal. Another of the switching transistors permits current to be removed from the capacitor when switched on in response to the charge down signal. The switching transistor of source current is controlled by the charge up signal and the switching transistor of sink current is controlled by the charge down signal. The phase detector receives the reference clock signal, an additional reference signal, and the feedback clock signal. The phase detector generates a charge up control signal having a first duration of time in response to a first edge of the reference clock signal. A charge down control signal has a second duration of time in response to an edge of the feedback clock signal occurring within less than 180 degrees from the first edge. The first duration of time is substantially similar to a first time between the first edge of the reference clock signal and the edge of the feedback clock signal. The second duration of time is substantially similar to a second time between the edge of the feedback clock signal and a midway signal edge occurring between the first edge and a subsequent edge of the reference clock signal.

Conveniently, during one period of the reference clock signal the charge pump is, in some examples, disabled during about half of the period.

Expediently, the phase detector includes, in some examples, at least four D Flip-Flops, and each of the clock signals is received by at least one of the D Flip-Flops at a clock input.

According to yet another example embodiment, there is a delay-locked loop that includes a voltage control delay line for receiving a reference clock signal. A phase detector also receives the reference clock signal and generates charge up and charge down control signals dependent upon a phase difference between the reference clock signal and a feedback clock signal. A loop filter includes a capacitor. The loop filter integrates the charge up and charge down control signals to provide a variable bias voltage for selecting a delay to be added to the reference clock signal by the voltage control delay line. A source portion of a charge pump includes at least one switching transistor, a first sourcing transistor and at least another sourcing transistor. The sourcing transistors are in electrical communication with the capacitor. At least a current carrying terminal of the first sourcing transistor is electrically connected to a current carrying terminal of the source portion switching transistor. The source portion switching transistor is controlled by the charge up control signal and, if switched on, permits current to be sourced via the first sourcing transistor into the capacitor. The source portion further includes means for disabling the sourcing of current via the first sourcing transistor. A sink portion of the charge pump includes at least one switching transistor, a first sinking transistor and at least another sinking transistor. The sinking transistors are in electrical communication with the capacitor. At least a current carrying terminal of the first sinking transistor is electrically connected to a current carrying terminal of the sink portion switching transistor. The sink portion switching transistor is controlled by the charge down control signal and, if switched on, permits current to be sunk via the first sinking transistor from the capacitor. The sink portion further includes means for disabling the sinking of current via the first sinking transistor.

Conveniently, the current sourcing disabling means and the current sinking disabling means can, in some examples, each include a select transistor, the current sourcing or sinking via the first sourcing or sinking transistor being disabled if the select transistor is turned off.

Expediently, the current sourcing disabling means and the current sinking disabling means can, in some alternative examples, each include transmission gate means between a bias voltage terminal of a mirror master transistor and a bias voltage terminal of the first sourcing or sinking transistor, the current sourcing or sinking via the first sourcing or sinking transistor being disabled if the transmission gate means breaks a conduction path between the two bias voltage terminals.

Conveniently, the source portion switching transistor and the sourcing transistors can, in some examples, be PMOS transistors, and the sink portion switching transistor and the sinking transistors can, in some examples, be NMOS transistors.

Expediently, one current carrying terminal of each of the sourcing (or sinking) transistors can, in some examples, collectively all be electrically connected to the current carrying terminal (e.g. drain) of the source (or sink) portion switching transistor.

Conveniently, the charge pump can, in some alternative examples, further include another source portion switching transistor and another sink portion switching transistor, a current carrying terminal of the another sourcing transistor being electrically connected to a current carrying terminal of the another source portion switching transistor, and a current carrying terminal of the another sinking transistor being electrically connected to a current carrying terminal of the another sink portion switching transistor.

BRIEF DESCRIPTION OF THE DRAWINGS

Reference will now be made, by way of example, to the accompanying drawings which illustrate example embodiments.

DETAILED DESCRIPTION OF EXAMPLE EMBODIMENTS

Figure 1:
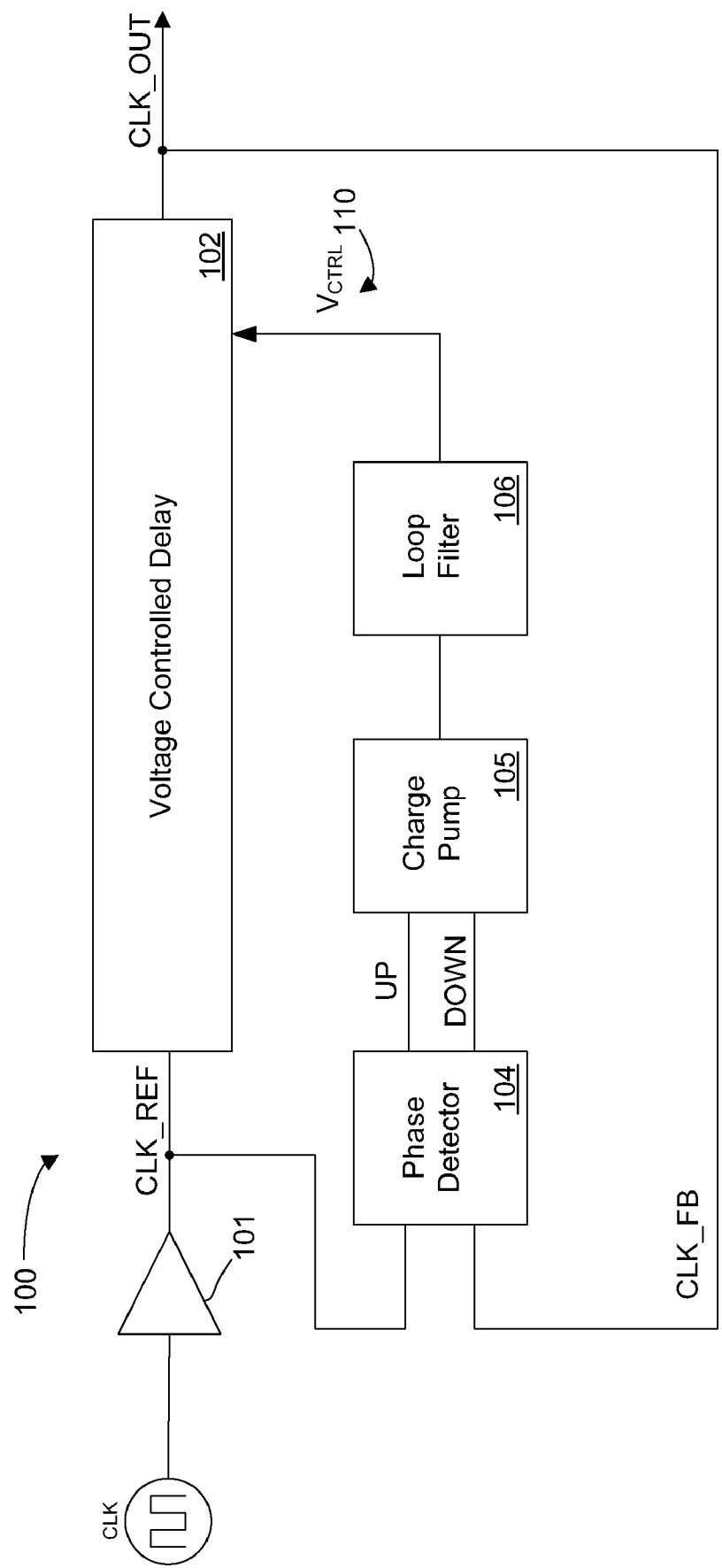
FIG. 1 is a block diagram of a prior art DLL.

In the following detailed description of example embodiments, a number of illustrated circuits and circuit components are of a type which performs known operations on electronic signals. Those skilled in the art will have knowledge of alternative circuits or circuit components which are recognized as equivalent because they provide the same operations on the signals. Similar or the same reference numerals and labeling may have been used in different figures to denote similar components or signals.

Referring now to the drawings, FIG. 1 is a block diagram of a prior art Delay-Locked Loop (DLL) 100. In the DLL 100, an externally supplied clock (CLK) is buffered by clock buffer 101 to provide a reference clock (CLK_REF). As understood by those skilled in the art, the CLK signal could be, for example, a data strobe signal (DQS or DQSb signal) transmitted from a memory controller to a memory device. However, it is of course possible that the CLK signal will, in alternative examples, be some other type of clock signal. Continuing on with the discussion of the DLL block diagram of FIG. 1, it will be seen that CLK_REF is coupled to a Voltage Controlled Delay Line (VCDL) 102 and a phase detector 104. The VCDL 102 produces an output clock (CLK_OUT), which is a delayed version of CLK_REF and is routed to various circuits within the device containing the DLL 100. As shown, CLK_OUT is also routed to the phase detector 104, and thus the phase detector 104 receives CLK_OUT as a feedback clock signal, referred to as CLK_FB.

With respect to phase shifting by the DLL, those skilled in the art will appreciate that in some memory systems where the timing signal being phase shifted is DQS or DQSb (the complement of DQS), the timing signal will be shifted by 90 degrees so that the edges of the timing signal are centered with respect to its associated data. Also, as clock frequencies in memory systems become increasingly higher, the ability to make fine-tuned phase shifting adjustments will continue to become increasingly useful.

Still with reference to the illustrated DLL 100, the phase detector 104 generates phase control signals (UP/DOWN) dependent on the phase difference between CLK_REF and CLK_FB. The phase control signals (UP/DOWN) of the phase detector 104 are provided to a charge pump 105, the output thereof which is conditioned by a loop filter 106 to provide a variable bias voltage $V_{CTRL}$ 110. Those skilled in the art will understand that loop filter 106 can include any number of passive components arranged in a desired configuration. The bias voltage $V_{CTRL}$ selects the delay to be added to CLK_REF by the VCDL 102 to provide for the proper phase relation between CLK_FB and CLK_REF. VCDL 102 can be implemented with a variety of known circuits.

Figure 2:
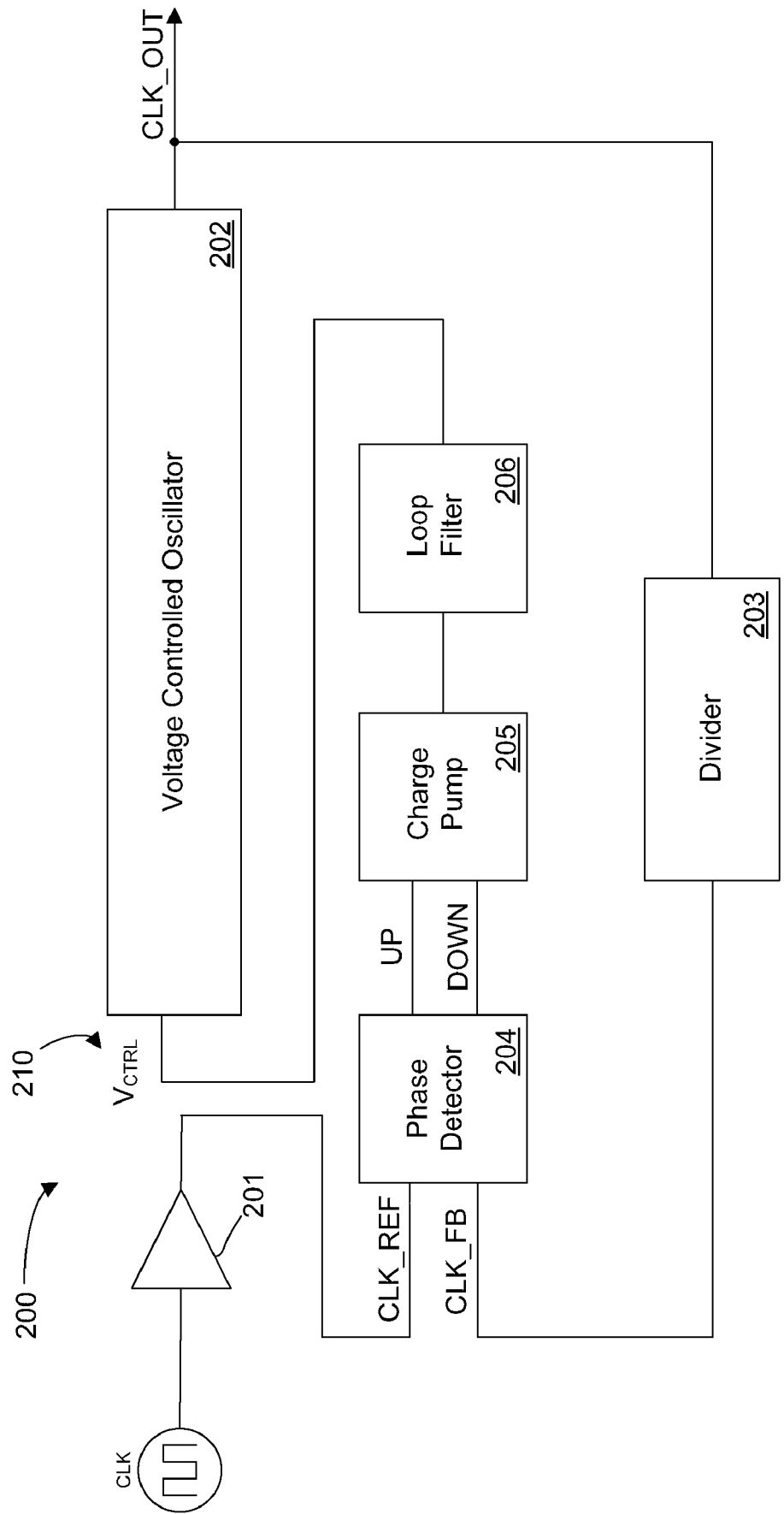
FIG. 2 is a block diagram of a prior art PLL.

Another type of feedback system known to those skilled in the art of memory design is a Phase-Locked Loop (PLL). FIG. 2 is a block diagram of a prior art PLL 200. An externally supplied clock (CLK) is buffered by clock buffer 201 to provide a reference clock (CLK_REF) that is coupled to a phase detector 204. The phase detector 204 generates phase control signals (UP/DOWN) dependent on the phase difference between CLK_REF and CLK_FB.

The phase control signals (UP/DOWN) of the phase detector 204 are provided to a charge pump 205, the output thereof which is conditioned by a loop filter 206 to provide a variable bias voltage $V_{CTRL}$ 210. The bias voltage $V_{CTRL}$ controls a Voltage Controlled Oscillator (VCO) 202 which outputs a clock signal CLK_OUT. The frequency of the output clock signal CLK_OUT is proportional to the bias voltage $V_{CTRL}$ 210. Also, the CLK_OUT signal is optionally coupled to a divider 203 to produce the CLK_FB signal.

Having now described the general architecture of PLLs and DLLs, it will be understood that the operation of a particular DLL will not always be independent of other PLLs present in the larger memory design. For example, two 90 degree phase shifted DQS and DQSb signals available within a master PLL can be provided to a slave DLL. It will be understood that, in such circumstances, the slave DLL output is dependent upon the phase and frequency information that the master PLL provides. This dependency is not necessarily disadvantageous, and it has been found, generally speaking, that slave DLLs relying upon master PLLs, as described above, provide output clocks that are, for a large majority of presently existing applications, properly phase shifted relative to the reference clock.

From the preceding cursory descriptions of PLLs and DLLs, it will be seen that if a PLL is examined and its components are compared to a DLL, one will find that at least some of the components of the PLL are similar to components in the DLL. For one, both a PLL and a DLL include a phase detector. Additionally, both a PLL and a DLL include a charge pump.

Figure 3:
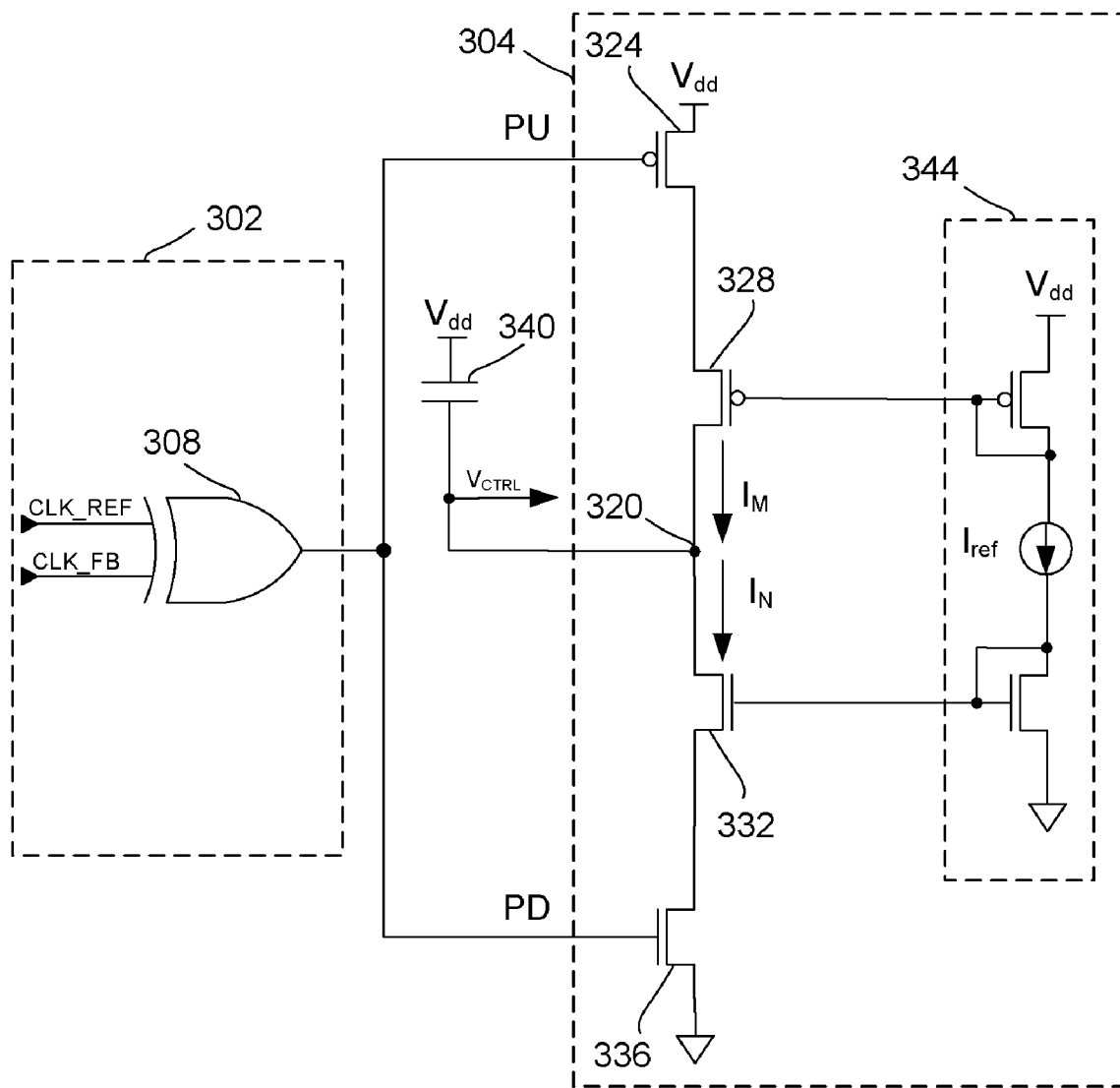
FIG. 3 is a circuit schematic of a phase detector and a charge pump that receives control signals from the phase detector.

Turning now to FIG. 3, there is a circuit schematic representation of an XOR-type phase detector 302 and a charge pump 304 (some circuit components not relevant to an understanding of example embodiments may have been omitted from FIG. 3). Those skilled in the art will appreciate that while XOR-type phase detectors can be employed in both DLLs and PLLs, their use is more common in DLLs; however their use in PLLs is also possible if the relevant design issues (for example, harmonic locking) are addressed.

Figure 4:
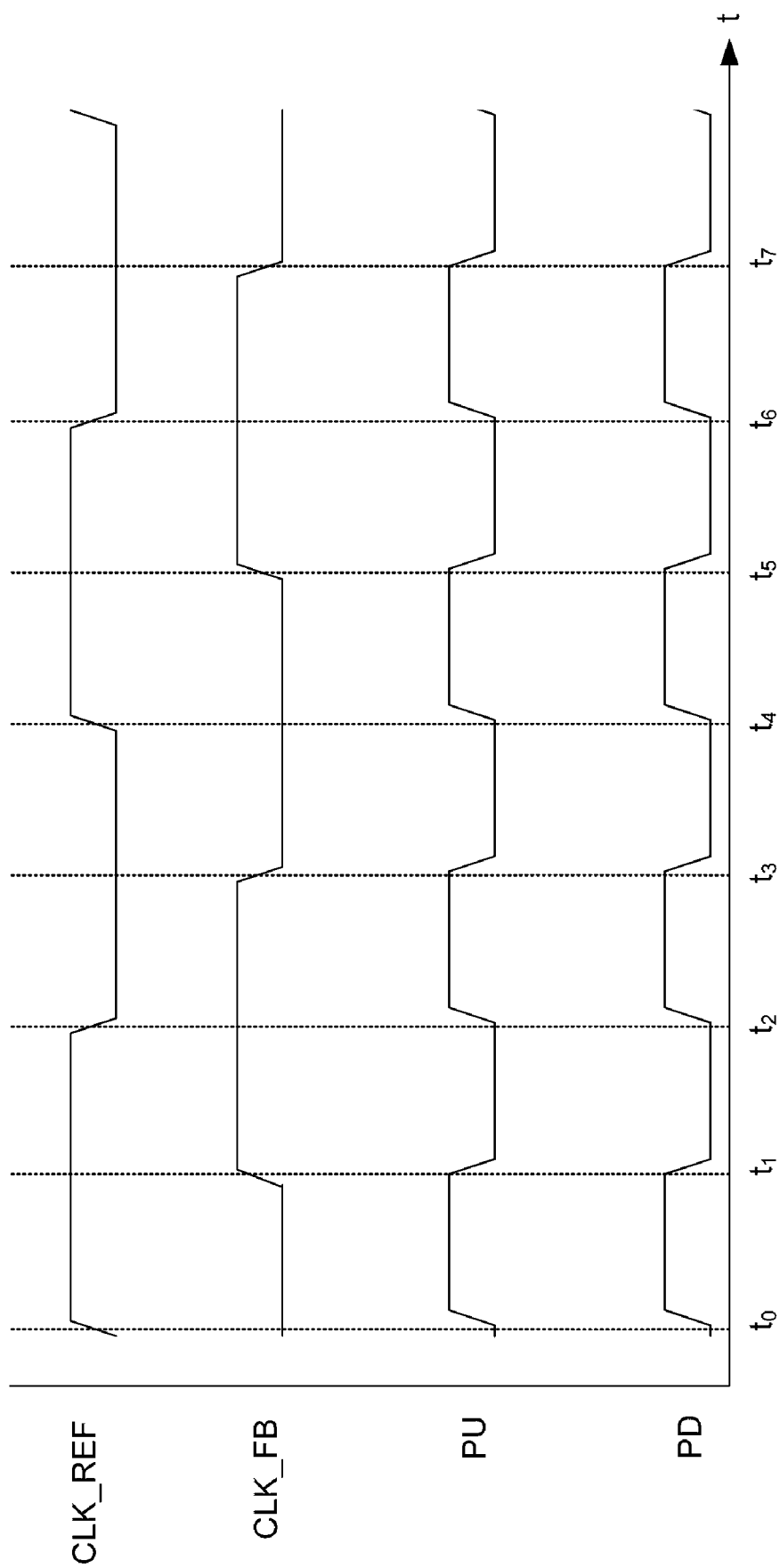
FIG. 4 is a timing diagram illustrating the operation of the phase detector of FIG. 3.

The phase detector 302 is level sensitive and includes an XOR logic gate 308 to which the signals CLK_REF and CLK_FB are applied at the inputs of the XOR logic gate 308. The output of the XOR logic gate 308 is electrically connected to both the gate of the switching transistor 324 and the gate of the switching transistor 336. In operation, when the two compared signals CLK_REF and CLK_FB are completely in phase, the pair of in phase inputs to the XOR logic gate 308 will result in XOR gate outputting a constant level of logic '0'. When the two compared signals CLK_REF and CLK_FB are 180 degrees apart (one is logic '0' when the other is logic '1', and vice versa) the XOR logic gate 308 puts out a steady logic '1' signal. Between the two extremes, the XOR logic gate 308 outputs logic '1' for half of the cycle. Thus, FIG. 4 is a timing diagram illustrating CLK_REF, CLK_FB, Pulse Up (PU) control signal and Pulse Down (PD) control signal when the XOR logic gate 308 outputs logic '1' for half of the cycle. (It has been assumed for the above description that both compared signals CLK_REF and CLK_FB have 50 percent duty cycles.)

With respect to the illustrated charge pump 304, it includes a source portion and a sink portion between which is a $V_{CTRL}$ node 320. The sourcing portion includes a switching transistor 324 and a sourcing transistor 328, which are PMOS transistors in the illustrated example. The sinking portion includes a switching transistor 336 and a sinking transistor 332, which are NMOS transistors in the illustrated example. The illustrated charge pump 304 also includes a current mirror 344 for mirroring current in the transistors 328 and 332. Generally, current mirror 344 is a reference current source circuit. The current mirror 344 also establishes the bias voltages being applied to the gates of the transistors 328 and 332. A capacitor 340 has one terminal electrically connected to $V_{dd}$ and another terminal electrically connected to the $V_{CTRL}$ node 320. As will be appreciated by those skilled in the art, $V_{CTRL}$ can be changed by net charging or net discharging of the capacitor 340, and by bringing about a change in $V_{CTRL}$, a phase shift can be effected. Capacitor 340 can be a passive component of the loop filter, or alternately, capacitor 340 can be a component of charge pump 304.

Charging is achieved by adding current to the capacitor 340, while discharging is achieved by removing current from the capacitor 340. It will be seen that if currents $I_M$ and $I_N$ have equal magnitudes over a period of time, then the capacitor 340 will continually charge and discharge by equal amounts and equal durations resulting in no net change to voltage $V_c$ at the $V_{CTRL}$ node 320.

The conditions for equal $I_M$ and $I_N$ magnitudes in the illustrated example charge pump is as follows. $I_M$ and $I_N$ will have equal magnitudes if, for example (i) the width-to-length (W/L) ratio of the transistor 328 and the PMOS FET of the current mirror 344 are equal; and (ii) the W/L ratio of the transistor 332 and the NMOS FET of the current mirror 344 are equal. (In at least one example, regulation of current is further facilitated by use of an operational amplifier as described and illustrated in commonly assigned US patent application Publication No. 2005/0162200 of Haerle.)

With respect to when $I_M$ and $I_N$ will have equal durations in the illustrated example charge, under the assumption of clocks of 50 percent duty cycle, $I_M$ and $I_N$ will repeatedly be current pulses of the same duration if the CLK_FB signal is phase shifted by 90 degrees with respect to the CLK_REF signal.

FIG. 4 is a sequence, or timing, diagram showing the operation of phase detector 302 of FIG. 3. FIG. 4 illustrates traces for input signals CLK_REF, CLK_FB and output signals PU and PD. It is assumed that the circuit is operating at a steady state, meaning that CLK_FB has reached the 90 degree phase shift relative to CLK_REF. As shown in FIG. 4, in one full CLK_REF clock cycle (ie. between $t_0$ and $t_4$), signals PU and PD will cycle between the high and low logic states. Therefore, transistors 324 and 336 are constantly, and alternately, turned on and off.

Figure 5:
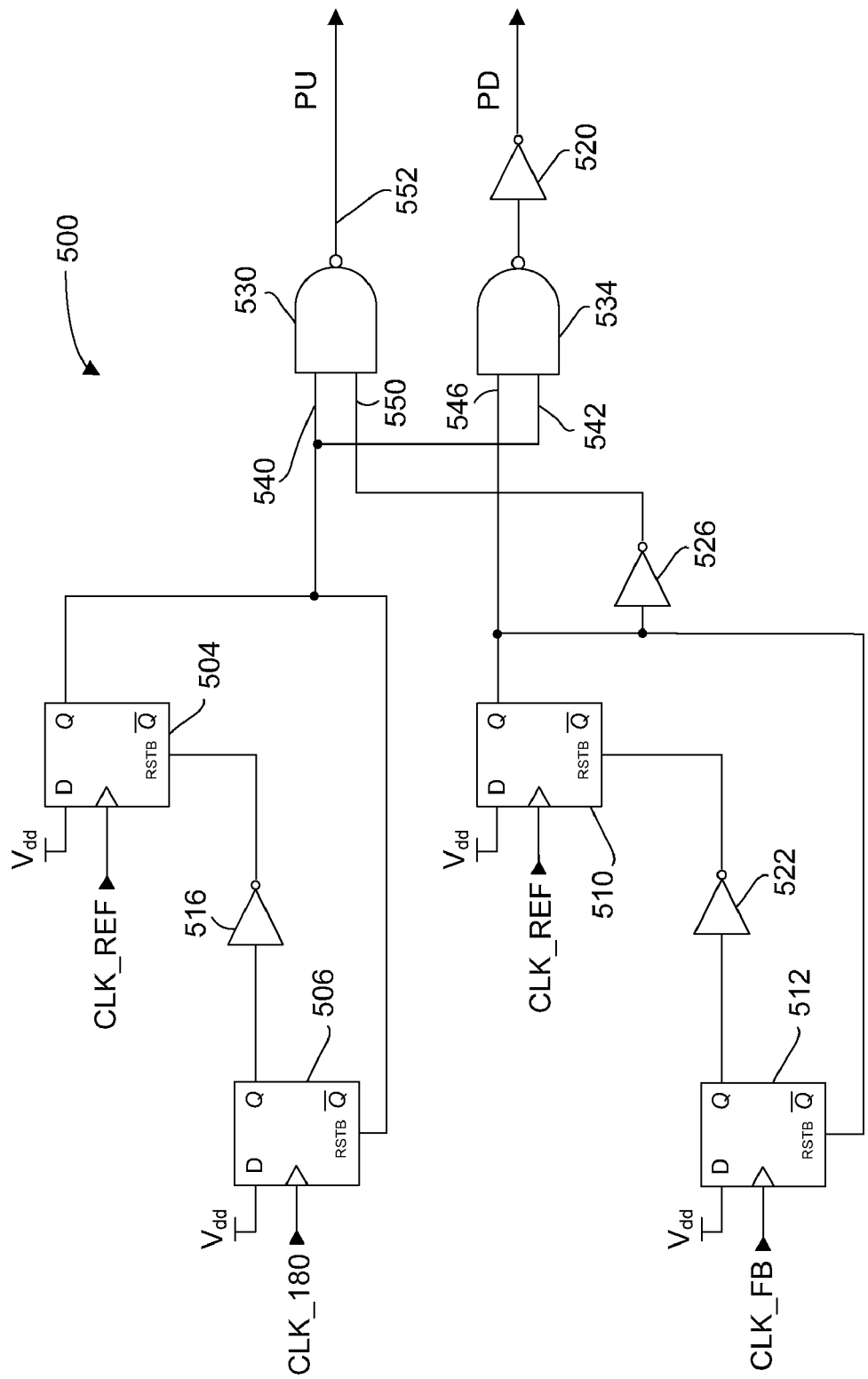
FIG. 5 is a circuit schematic of a phase detector in accordance with an example embodiment.

Reference will now be made to FIG. 5. FIG. 5 is a circuit schematic of a phase detector 500 in accordance with an example embodiment. As will be appreciated by those skilled in the art, not all components that will be present in an actual implementation have been illustrated, these absent components having been omitted in order to improve clarity and with an appreciation that their inclusion would not consequently impact an understanding of the illustrated example embodiment. The phase detector 500 can be employed within a DLL like the DLL shown in FIG. 1 (from a system perspective). Employment of the phase detector 500 within a PLL like the PLL shown in FIG. 2 (from a system perspective) may be less likely; however if the relevant design issues (for example, harmonic locking) are addressed, use of the phase detector 500 within PLLs is also possible. Also, the phase detector 500 may, in some examples, be used in combination with the charge pump circuits of FIGS. 7 and 8 (descriptions of which are provided in later paragraphs of this disclosure).

The illustrated phase detector 500 includes: four D Flip-Flops 504, 506, 510 and 512, four inverters 516, 520, 522 and 526, and two NAND logic gates 530 and 534. The illustrated phase detector 500 receives four input signals: CLK_REF, CLK_FB, CLK_180 and $V_{dd}$. CLK_REF is electrically connected to the clock inputs of the D Flip-Flops 504 and 510. (Each of the D Flip-Flops illustrated in FIG. 5 is rising-edge triggered.) CLK_FB is electrically connected to the clock input of the D Flip-Flop 512. CLK_180, which is a 180 degree phase shifted version of CLK_REF, is electrically connected to the clock input of the D Flip-Flop 506. Finally, $V_{dd}$ is electrically connected to the inputs of the D Flip-Flops 504, 506, 510 and 512.

Still with reference to the D Flip-Flops, the output of the D Flip-Flop 504 is electrically connected to a first input of the NAND logic gate 530, a first input of the NAND logic gate 534, and the reset (RSTB) terminal of the D Flip-Flop 506. Also, the output of the D Flip-Flop 506 is electrically connected to the input of the inverter 516, the output of the inverter 516 being electrically connected to the RSTB input of the D Flip-Flop 504. The output of the D Flip-Flop 510 is electrically connected to a second input of the NAND logic gate 534, and also the RSTB input of D Flip-Flop 512 and the input of inverter 526, the output of the inverter 526 being electrically connected to a second input of the NAND logic gate 530. Additionally, the output of the D Flip-Flop 512 is electrically connected to the input of inverter 522, the output of the inverter 522 being electrically connected to the RSTB input of the D Flip-Flop 510.

A Pulse UP (PU) control signal provided to a charge pump is generated at the output of the NAND logic gate 530. (It will be understood that the term charge up control signal used in this application also refers to a control signal for controlling charging within a charge pump.) A Pulse Down (PD) control signal, which is also provided to the charge pump, is generated at the output of the inverter 520, the output of the NAND logic gate 534 being electrically connected to the input of the inverter 520. (It will be understood that the term charge down control signal used in this application also refers to a control signal for controlling discharging within a charge pump.)

In operation, the PU and PD signals produced by the illustrated phase detector 500 will cause, within the charge pump to which these signals are electrically connected, $V_{CTRL}$ node capacitor charging/discharging activity during only half of the clock period. This behavior of the phase detector 500 will be apparent when the operation of the D Flip-Flops 504, 506, 510 and 512 is understood.

Figure 6:
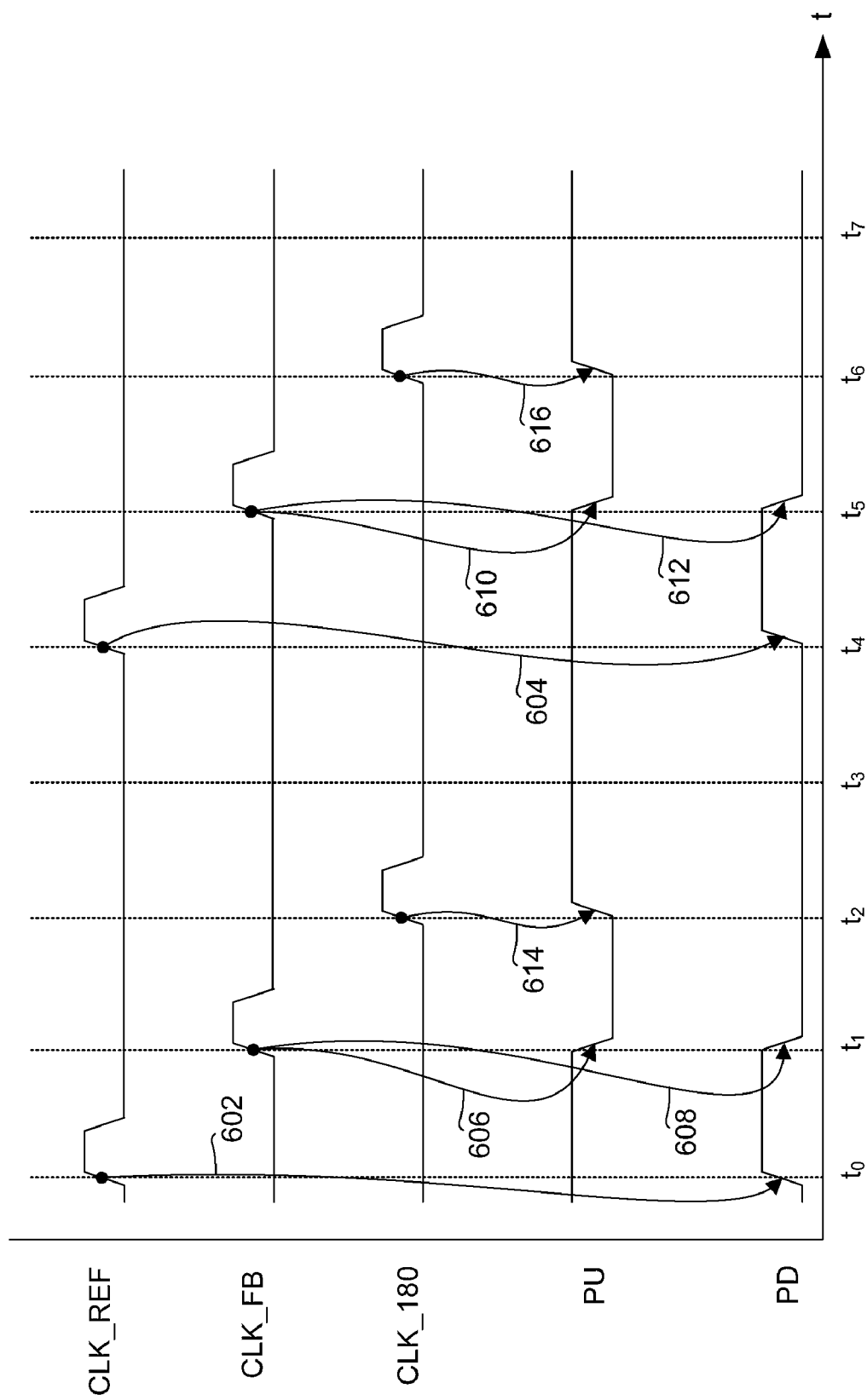
FIG. 6 is a timing diagram illustrating the operation of the phase detector of FIG. 5.

In the behavioral description of the phase detector 500 that follows, reference will be made to both FIGS. 5 and 6. FIG. 6 is a timing/sequence diagram illustrating the operation of the phase detector 500 with CLK_FB phase shifted 90 degrees relative to CLK_REF (as previously explained, in some examples this will be the desired phase shift for the clock signal so that the clock signal is properly aligned in the center of its associated data). Also, it will be understood that the clock signals illustrated in FIG. 6 have duty cycles that are significantly less than 50 percent, but have the same period as the clock signals shown in FIG. 4. Those skilled in the art will understand that clocks having a 50 percent duty cycle can be used.

As explained in more detail below, in response to detection of a rising edge of CLK_REF (reference clock signal) the PD control signal will change logic levels (logic '0' to logic '1') and also the logic level of the PU control signal will be maintained (the logic level will stay at logic '1') thereby enabling charge pump discharging, while keeping charge pump charging disabled. Referring to the D Flip-Flops 504 and 510, these Flip-Flops output the logic level on their input, which is logic '1' ($V_{dd}$) on the rising edge of CLK_REF. The logic '1' on the output of the D Flip-Flop 504 is received at an input 540 of the NAND logic gate 530 and at an input 542 of the NAND logic gate 534. The logic '1' at the output of the D Flip-Flop 504 is also received by the RSTB input of the D Flip-Flop 506, which is ignored because the RSTB input is active "low". The logic '1' at the output of the D Flip-Flop 510 is received by input 546 of the NAND logic gate 534 and the input of the inverter 526, which inverts the logic '1' to a logic '0' that is received at input 550 of the NAND logic gate 530. The logic '1' at the output of the D Flip-Flop 510 is also received by the RSTB input of the D Flip-Flop 512, but again, as previously explained, the D Flip-Flop 512 ignores this. If a logic '1' received at the input 540 and a logic '0' is received at the input 550, output 552 of the NAND logic gate 530 will be logic '1'. Therefore, the PU signal is logic '1' with the result being that charging in the charge pump remains disabled. With a logic '1' signal on the input 546 of the NAND logic gate 534 and a logic '1' signal on the input 542 of the NAND logic gate 534, the output of the NAND logic gate 534 is logic '0'. The inverter 520 inverts the signal so that the PD signal will be logic '1' enabling the charge pump, with respect to which the phase detector 500 communicates its control signals, to carry out discharging. Thus, in response to detection of a rising edge of CLK_REF, the PD control signal will change logic levels, as shown by transition arrows 602 and 604 in FIG. 6.

The next rising edge occurs in the CLK_FB signal (feedback clock signal). (Those skilled in the art will appreciate that harmonic locking problems can occur in PLLs if the edge of the CLK_FB signal becomes more than 180 degrees out of phase from the corresponding edge in the CLK_REF signal.) As explained in more detail below, in response to detection of the rising edge of CLK_FB, the PU control signal will change logic levels (logic '1' to logic '0') and also the PD control signal will change logic levels (logic '1' to logic '0') thereby enabling charge pump charging and disabling charge pump discharging. Referring to the D Flip-Flop 512, its clock input receives the CLK_FB signal. In response, the D Flip-Flop 512 outputs a logic '1' which is inverted by the inverter 522. A logic '0' at the RSTB input of the D Flip-Flop 510 forces the output of the D Flip-Flop 510 to logic '0', and this change in logic levels causes logic '0' to be received at the input 546 and logic '1' to be received at the input 550. The outputs of the NAND logic gates 530 and 534 now change their logic levels so that the PU signal changes from logic '1' to logic '0' enabling charging within the charge pump, and also the PD signal changes from logic '1' to logic '0' disabling discharging within the charge pump. Thus, in response to detection of a rising edge of CLK_FB, both the PU and PD control signals will change logic levels, as shown by transition arrows 606, 608, 610 and 612 in FIG. 6. The transition of the PD signal from the active logic level to the inactive logic level marks the end of a duration of time substantially similar to a time between the edge of CLK_REF at $t_0$ and the edge of CLK_FB at $t_1$.

The next rising edge occurs in the CLK__180 signal (an additional reference clock signal, phase shifted 180 degrees from CLK_REF, so that its rising edge is about midway between sequential rising edges of CLK_REF, providing indication of this midway point in time). As explained in more detail below, in response to detection of the rising edge of CLK__180 signal, the PU control signal will change logic levels (logic '0' to logic '1') and also the logic level of the PD control signal will be maintained (the logic level will stay at logic '0') thereby disabling charge pump charging and keeping charge pump discharging disabled. Referring to the D Flip-Flop 506, its clock input receives the CLK__180 signal. In response, the D Flip-Flop 506 outputs a logic '1' which is inverted by the inverter 516. A logic '0' at the RSTB input of the D Flip-Flop 504 forces the output of the D Flip-Flop 504 to logic '0', and this change in logic levels causes a logic '0' to be received the input 540 of the NAND logic gate 530, so the output of the NAND logic gate 530 changes from logic '0' to logic '1' while the outputs of the NAND gate 534 and the inverter 520 remain unchanged. Therefore, the PU signal changes from logic '0' to logic '1' disabling charging within the charge pump, and also the logic level of the PD signal will be maintained (the logic level will stay at logic '0') keeping charge pump discharging disabled. Thus, in response to detection of a rising edge of CLK__180, the PU control signal will change logic levels, as shown by transition arrows 614 and 616 in FIG. 6. The transition of the PU signal from the active logic level to the inactive logic level marks the end of a duration of time substantially similar to a time between the edge of CLK_FB at $t_1$ and the edge of CLK__180 at $t_2$.

In a steady state, the change in the PU and PD signals triggered by the CLK_FB rising edge will occur about one quarter of a clock period subsequent to the previous change in the PD signal triggered by the rising edge of the CLK_REF signal. During the roughly one quarter clock period between the CLK_REF and the CLK_FB rising edge, discharging occurs and charging does not occur. Also in the steady state, the change in the PU signal triggered by the CLK__180 rising edge will occur about one quarter of a clock period subsequent to the previous change in the PU and PD signals triggered by the rising edge of the CLK_FB signal. During the roughly one quarter clock period between the CLK_FB and the CLK__180 rising edge, charging occurs and discharging does not occur. During the remainder of the clock period neither charging nor discharging occurs. For example, during a half clock period between times $t_2$ and $t_4$ (see timing diagram of FIG. 6) neither charging nor discharging occurs (i.e., the PU and PD signals from the phase detector 500 would result in the switching transistors of the DLL's charge pump both being simultaneously switched off for half of the clock period, and hence the loop filter capacitor would be neither charged nor discharged during that period). During a corresponding period of time $t_2$ to $t_4$ for the phase detector 308 of FIG. 3, charging and discharging is occurring (see the logic levels of the PU and PD signals in the timing diagram of FIG. 4). The phase detector 500 may thus have the advantage of permitting implementation of a DLL with reduced power consumption as compared to the phase detector 308.

The phase detector 500 eliminates the need for the reference clock signals that were previously discussed in previous paragraphs of the disclosure, or in other words, the phase detector 500 eliminates the need to have available a master DLL or PLL that would ordinarily provide the two reference clock signals used for phase shifting (however, as explained previously and as will be discussed in more detail below, the CLK__180 signal will, in some examples, be provided to the phase detector in order for the phase detector to operate as intended).

It will be understood that an additional characteristic of the illustrated phase detector 500 is that it is edge triggered rather than level sensitive. Typically, an edge triggered phase detector will not be subject to the same duty cycle requirements that a level sensitive phase detector is subject to.

Those skilled in the art will also appreciate that phase control signals similar to those generated by the illustrated phase detector 500 can be generated by alternative phase detectors comprised of different logic gates and circuitry than the phase detector 500. For example, where CLK_REF is a 50 percent duty cycle clock, by replacing the D Flip-Flop 506 with one that is falling-edge triggered rather than rising-edge triggered, CLK_REF can be applied to the substituted D Flip-Flop, eliminating the need for CLK__180. With the D Flip-Flops 504 and 510 being triggered on a rising edge of the CLK_REF signal, the flip-flop put in substitution for the D Flip-Flop 506 is triggered on the falling edge (edge next in succession to the rising edge). While the above described implementation can be realized in some systems having phase detectors, it should be noted that in at least some instances it may be difficult to produce and make available a 50 percent duty cycle clock.

In some example embodiments, generated phase control signals may not exhibit the same logic level transitions that are characteristic of the illustrated phase detector 500. As a simple example, if one were to add inverters along the paths between the phase detector and the gates of the switching transistors 324 and 336 (FIG. 3) one of skill in the art could readily alter the design of the phase detector to respond to the previously described clock edges in a similar manner, but with generated phase control signals having bit (logic level) sequences opposite to those of the phase detector 500.

Other alternative example phase detectors are also contemplated. For instance, it will be understood that it would be straightforward for one of skill in the art to modify the illustrated phase detector 500 to realize a phase detector that would respond to falling clock edges rather that rising clock edges. Such a phase detector could achieve at least substantially the same effects and benefits associated with the illustrated phase detector 500.

Figure 7:
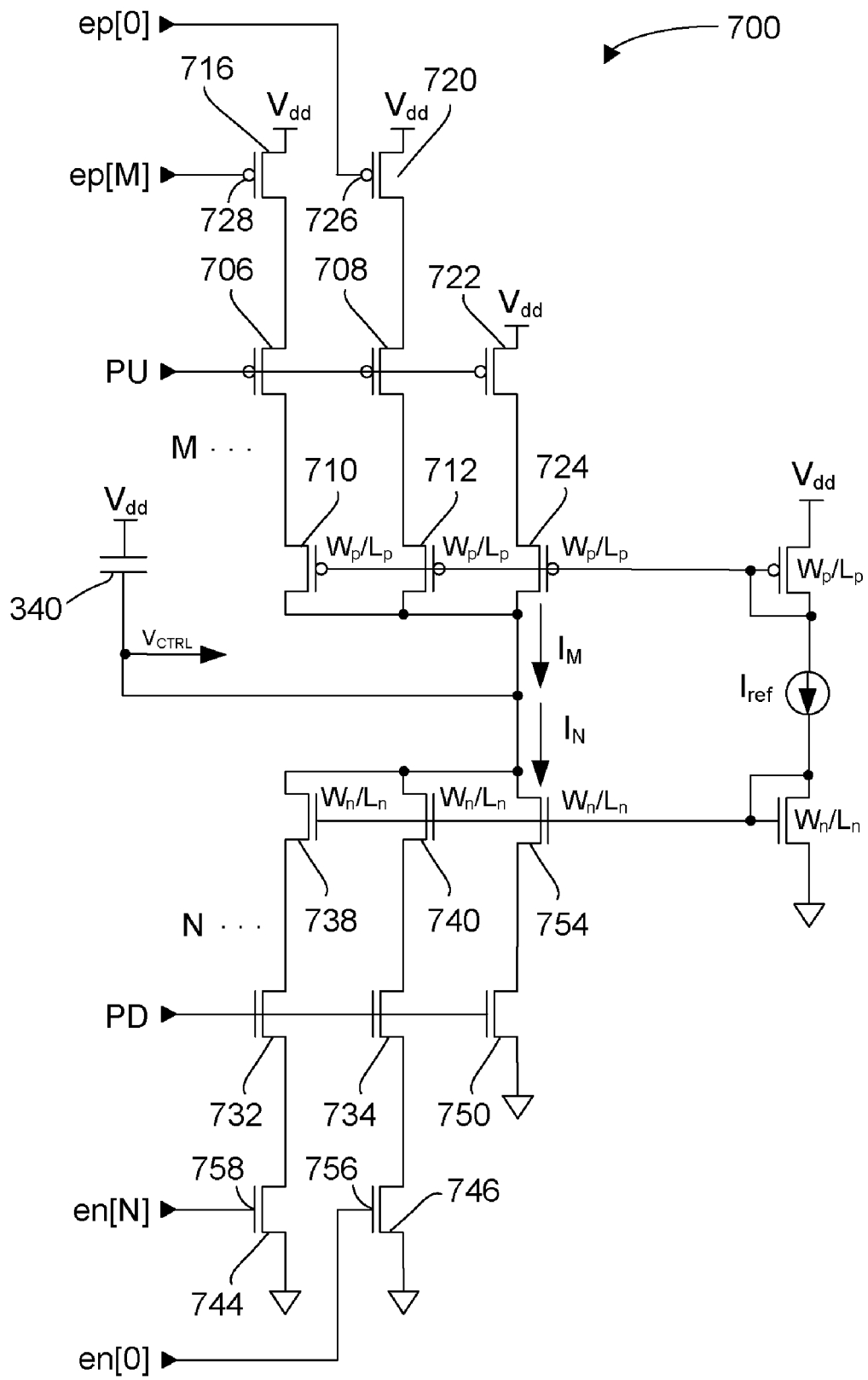
FIG. 7 is a circuit schematic of a charge pump in accordance with an example embodiment.

Reference will now be made to FIG. 7. FIG. 7 is a circuit schematic of a charge pump 700, in accordance with an example embodiment. As is known in the art, charge pump circuits uses capacitors to create either a higher or lower voltage. With respect to PLLs, a charge pump can be used to provide a control voltage applied to the VCO of the PLL. With respect to DLLs, a charge pump can be used to provide a control voltage for the VCDL of the DLL.

Referring now to the source portion of the illustrated charge pump 700, in this portion there are secondary switching transistors 706 and 708, secondary sourcing transistors 710 and 712, and select transistors 716 and 720. When current flows through primary switching transistor 722 and primary sourcing transistor 724, current will only flow through the secondary switching transistor 708 and the secondary sourcing transistor 712 if a logic '0' signal is applied to gate 726 of the select transistor 720, and current will only flow through the secondary switching transistor 706 and the secondary sourcing transistor 710 if a similar logic '0' signal is applied to gate 728 of the select transistor 716. Thus, the sourcing of current via one or more of the secondary sourcing transistor 710 and 712 can be disabled if one or more of the select transistors 716 and 720 is made non-conducting. In the presently shown embodiment, gate 726 is controlled by enabling signal ep[0] and gate 756 is controlled by enabling signal en[0], while gate 728 and 758 are controlled by enabling signals ep[M] and en[N] respectively. M and N are integer values greater than 0, as there can be any number of select transistors and secondary switching transistors included in the circuit of FIG. 7. In various alternate embodiments, N can be equal to M, or N can be different from M. $I_M$, which is the sum of the currents sourced through the sourcing transistors 710, 712 and 724, tracks $I_{ref}$.

In the sink portion of the illustrated charge pump 700, there are secondary switching transistors 732 and 734, secondary sinking transistors 738 and 740, and select transistors 744 and 746. When current flows through primary switching transistor 750 and primary sinking transistor 754, current will only also flow through the secondary switching transistor 734 and the secondary sinking transistor 740 if a logic '1' signal is applied at gate 756 of the select transistor 746, and current will only flow through the secondary switching transistor 732 and the secondary sinking transistor 738 if a similar logic '1' signal is applied at gate 758 of the select transistor 744. Thus, the sinking of current via one or more of the secondary sinking transistor 738 and 740 can be disabled if one or more of the select transistors 744 and 746 is made non-conducting. $I_N$, which is the sum of the currents sunk through the sinking transistors 738, 740 and 754, tracks $I_{ref}$.

As will be appreciated by those skilled in the art, source portion current $I_M$ will be greatest when all three of the sourcing transistors 710, 712 and 724 are sourcing current, and $I_M$ will be smaller when one or more of the select transistors 716 and 720 are turned off so that one or more of the secondary sourcing transistors 710 and 712 do not source additional current. Similarly, sink portion current $I_N$ will be greatest when all of the sinking transistors 738, 740 and 754 are sinking current. However, $I_N$ will be less if one or more of the select transistors 744 and 746 are turned off so that one or more of the secondary sinking transistors 732 and 734 will not sink additional current. In this manner, the illustrated charge pump 700 permits scaling of charge pump currents to be carried out.

If one takes into account that, in the illustrated charge pump 700, the phase shift corresponding to steady state will approximately follow equation (1) below:

$$\text{Phase Shift} = 180 * I_N / (I_M + I_N) \quad (1)$$

It will be seen that scaling of charge pump currents as previously described provides for the ability to make fine-tuned adjustments in phase shifting. Also, if $I_N$ and $I_M$ are expressed as $(N+1)*I_{ref}$ and $(M+1)*I_{ref}$ respectively, where N and M represent the current mirror ratios, then the relationship expressed in equation (2) below also holds:

$$\text{Phase Shift} = 180 * (N+1) / (M+N+2) \quad (2)$$

As will be appreciated by those skilled in the art, a system that includes the charge pump 700 can also include a main controller having registers that provide the enable signals for controlling which of the select transistors 716, 720, 744 and 746 are made conducting or non-conducting. In particular, each of the enable signals from such main controller registers would be applied to one of the gates 726, 728, 756 and 758. Alternate example embodiments of FIG. 7 can include any number of select transistors and corresponding secondary switching transistors. These select transistors and corresponding secondary switching transistors can be sized identically to the explicitly shown select transistors and secondary transistors to provide substantially linear scaling of the currents $I_M$ and $I_N$. Alternately, these transistors can be sized differently to provide non-linear scaling of the currents $I_M$ and $I_N$. Furthermore, any combination and number of enable signals can be driven to the activate logic level to turn on their corresponding select transistors.

Figure 8:
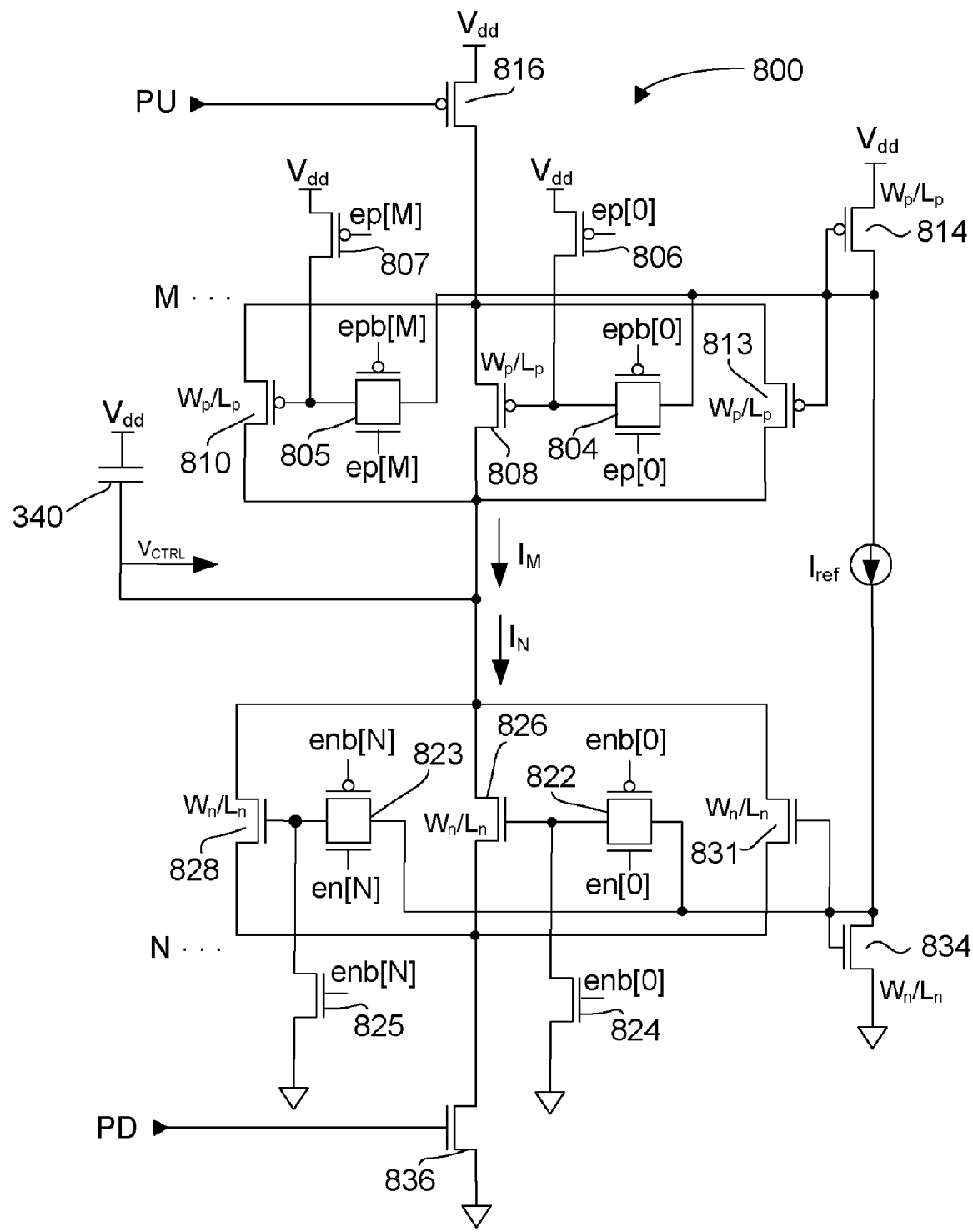
FIG. 8 is a circuit schematic of a charge pump in accordance with another example embodiment.

FIG. 8 is a circuit schematic of a charge pump 800, in accordance with another example embodiment. As will be evident from the explanation that follows, it will be seen that the charge pump 800 scales charge pump currents in a similar matter to the charge pump 700 of FIG. 7.

In the source portion of the illustrated charge pump 800, there are M sourcing transistors (two of which are shown and labeled 808 and 810), M transmission gates (two of which are shown and labeled 804 and 805), M pull-up transistors (two of which are shown and labeled 806 and 807), a mirror master transistor 814, and a switching transistor 816. It will be understood that the mirror master transistor 814 can mirror current in any one or more of the sourcing transistors 808 and 810, but only if the interposed transmission gate 804 and/or 805 enables a path for the master transistor 814 to mirror current to sourcing transistor(s). Thus, the sourcing of current via one or more of the M sourcing transistors can be disabled if path(s) through the transmission gate(s) are disabled. By contrast, the sourcing of current via sourcing transistor 813 is not impacted by any of the transmission gates 804. $I_M$, which is the sum of the currents sourced through the sourcing transistors 808, 810, 812 and 813, tracks $I_{ref}$.

In the sink portion of the charge pump 800, there are N sinking transistors (two of which are shown and labeled 826 and 828), N transmission gates (two of which are shown and labeled 822 and 823), N pull-down transistors (two of which are shown and labeled 824 and 825), a mirror master transistor 834, and a switching transistor 836. Again, the mirror master transistor 834 can mirror current into one or more of the sinking transistors 826 and 828, but only if the interposed transmission gates 822 and/or 823 enable a path for the master transistor 834 to mirror currents to sinking transistor(s). If one or more of the N transmission gates cause the path(s) between the sinking transistor(s) and the master transistor 834 to be closed, then current will not be mirrored into that/those sinking transistor(s). Thus, the sinking of current via one or more of the N sinking transistors can be disabled if path(s) through the transmission gate(s) are disabled. By contrast, the sinking of current via sinking transistor 831 is not impacted by any of the N transmission gates. $I_N$, which is the sum of the currents sunk through the sinking transistors 826, 828, 830 and 831, tracks $I_{ref}$.

As will be appreciated by those skilled in the art, the pull-up and pull-down transistors 806, 807, 824, 825 prevent the sourcing and the sinking transistors from turning on when their corresponding transmission gates are turned off. Also, it will be understood that each of the M transmission gates in the source portion of the charge pump 800 could be replaced by, for example, a PMOS transistor that would achieve a result similar to that achieved by use of a transmission gate. Similarly, each of the N transmission gates in the sink portion of the charge pump 800 could be replaced by, for example, an NMOS transistor that would achieve a result similar to that achieved by use of a transmission gate.

Still with reference to FIG. 8, it will be apparent that sourcing current $I_M$ will be largest when all three of the sourcing transistors 808, 810 and 813 are sourcing current, and when less than all three transistors are sourcing current, $I_M$ will be smaller. Similarly, it will be seen that $I_N$ will be largest when all three of the sinking transistors 826, 828 and 831 are sinking current, and $I_N$ will be smaller when less than all three sinking transistors are sinking current. In this manner, the illustrated charge pump 800 permits scaling of charge pump currents to be carried out.

If one takes into account that, in the illustrated charge pump 800, the phase shift corresponding to steady state will approximately follow equation (3) below:

$$\text{Phase Shift} = 180 * I_N / (I_M + I_N) \quad (3)$$

It will be seen that scaling of charge pump currents as previously described provides for the ability to make fine-tuned adjustments in phase shifting. Also, if $I_N$ and $I_M$ are expressed as $(N+1)*I_{ref}$ and $(M+1)*I_{ref}$ respectively, where N and M represent the current mirror ratios, then the relationship expressed in equation (4) below also holds:

$$\text{Phase Shift} = 180 * (N+1)/(M+N+2) \quad (4)$$

As will be appreciated by those skilled in the art, a system that includes the charge pump 800 can also include a main controller having registers that provide the enable signals ep[M:0] and epb[M:0] for controlling which of the M transmission gates in the source portion of the charge pump 800 are enabled or disabled, and for controlling which of the M pull-up transistors in the source portion of the charge pump 800 are made conducting or non-conducting. In particular, each of the enable signals from such main controller registers would be applied to at least one of the gates of the transmission gates and/or pull-up/pull-down transistors. Similar enable signals could also be provided in a similar manner for similar control in the sink portion of the charge pump 800.

Figure 9:
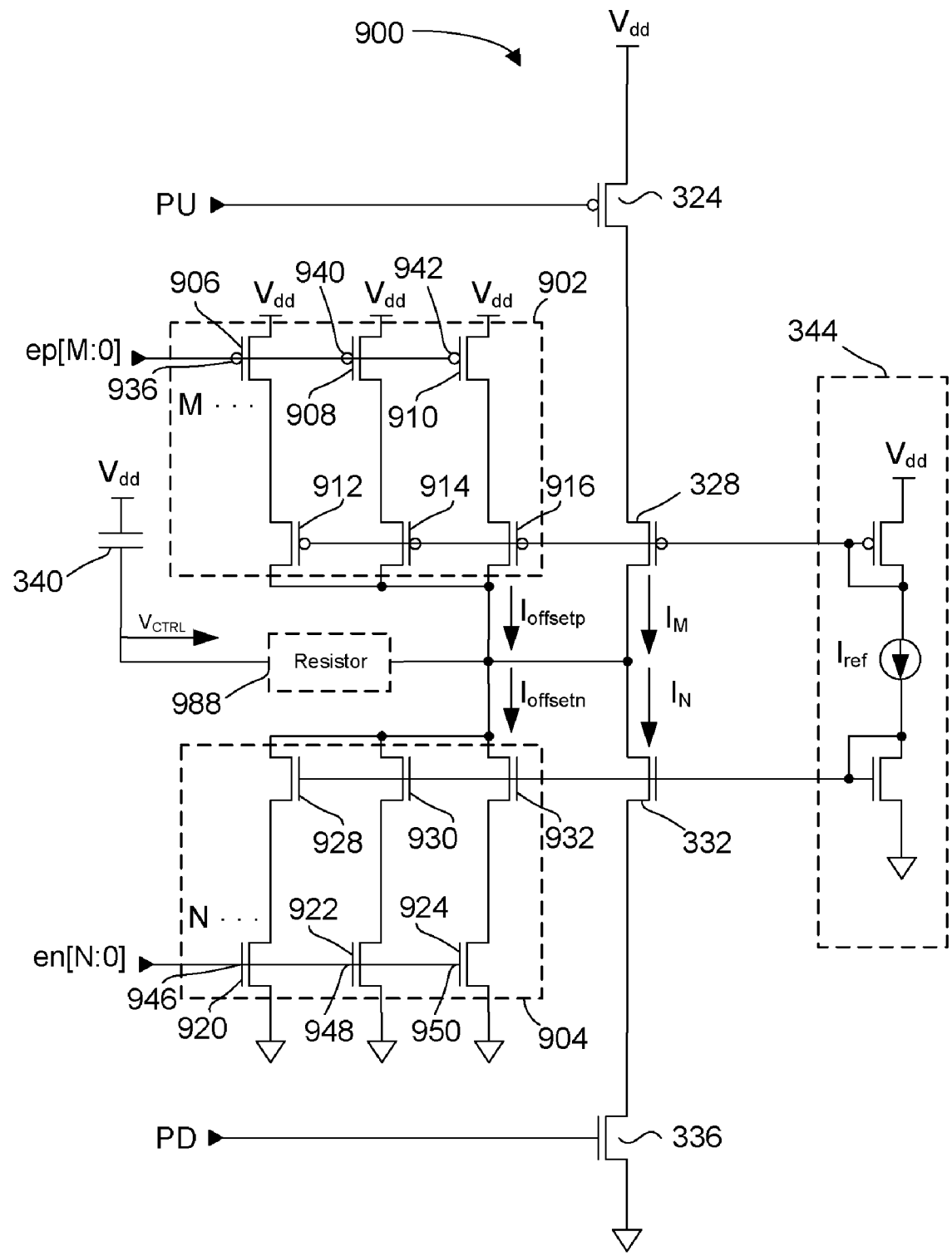
FIG. 9 is a circuit schematic of a charge pump in accordance with yet another example embodiment.

FIG. 9 is a circuit schematic of a charge pump 900 in accordance with yet another example embodiment. The operations of the sourcing transistor 328, the sinking transistor 332, the current mirror 344 and the switching transistors 324 and 336 have been previously described, and hence it is unnecessary to repeat what has been previously described in detail. In the previously shown charge pump embodiments, the magnitude of currents $I_M$ and $I_N$ provided when PU or PD are at their active logic levels, can be adjusted by selectively turning on secondary switching transistors, secondary sourcing transistors, and select transistors. This is due to the configuration of the shown charge pump circuits in which the transistors receiving control signals PU and PD are in series with the sourcing and sinking transistors. In the presently shown embodiment of FIG. 9, offset currents can be independently applied to currents $I_M$ and $I_N$. Typically, these offset currents will be continuously generated.

In at least one example, the PU and PD signals applied at the gates of the switching transistors 324 and 336 are generated by a Phase Frequency Detector (PFD) such as the PFD described in "Phase-Locked Loops: Design, Simulation, and Applications, 4$^{th}$ Edition", Best, Roland E., McGraw-Hill, ©1999 at pgs. 92-102, the entire contents of which are herein incorporated by reference.

Turning now to the source portion of the charge pump 900, there is a supplemental source circuit that in the illustrated example embodiment comprises a first programmable array of transistors 902 for generating offset current $I_{OFFSETP}$. Three of M pairs of PMOS transistors are shown within the illustrated programmable array of transistors 902, with transistors of each pair being connected in series. In the illustrated example embodiment, the circuitry for controlling current sourcing in each pair comprises a select transistor. Each of select transistors 906, 908 and 910 have their drains coupled to $V_{dd}$ and their sources electrically connected to the drains of one of sourcing transistors 912, 914 and 916.

The illustrated charge pump 900 also includes a supplemental sink circuit in the sink portion of the charge pump 900. In the illustrated example embodiment, the supplemental sink circuit comprises a second programmable array of transistors 904 for generating offset current $I_{OFFSETN}$. Three of N pairs of NMOS transistors are shown within the illustrated programmable array of transistors 904, with transistors of each pair being connected in series. In the illustrated example embodiment, the circuitry for controlling current sinking in each pair comprises a select transistor. Three select transistors 920, 922 and 924 are shown. Each of the select transistors 920, 922 and 924 has its drain coupled to ground potential and its source coupled to one of the drains of sinking transistors 928, 930 and 932.

$I_{OFFSETP}$, a positive phase shift producing current which is the sum of the currents sourced through the sourcing transistors 912, 914 and 916, tracks the charge pump current. In operation, $I_{OFFSETP}$ in the source portion of the charge pump 900 can be increased or decreased by turning on or turning off one or more of the select transistors 906, 908 and 910. The select transistors 906, 908 and 910 are turned on by applying a logic low signal at their respective gates 936, 940 and 942.

$I_{OFFSETN}$, a negative phase shift producing current which is the sum of the currents sunk through the sinking transistors 928, 930 and 932, tracks the charge pump current. $I_{OFFSETN}$ in the sink portion of the charge pump 900 can be increased or decreased by turning on or turning off one or more of the select transistors 920, 922 and 924. The select transistors 920, 922 and 924 are turned on when a logic high signal is applied to their respective gates 946, 948 and 950.

It will be understood that the offset currents can be used to cause phase shifting. For instance, the phase shift in the illustrated charge pump 900 is equal to the difference between $I_{OFFSETP}$ and $I_{OFFSETN}$ multiplied by 360 and divided by $I_M$. In some examples, the sourcing transistors of the programmable array 902 have, from the M$^{th}$ to the 1$^{st}$, incrementally larger device channel W/L ratios, and the sink transistors of the programmable array 904 also have, from the N$^{th}$ to the 1$^{st}$, incrementally larger device channel W/L ratios. For instance, the transistors 916 and 932, in one example, have equal device channel W/L ratios that are ½ the device channel W/L ratios of the transistors 328 and 332, the transistors 914 and 930 have device channel W/L ratios that are ⅓ the device channel W/L ratios of the transistors 328 and 332, and the transistors 912 and 928 have device channel W/L ratios that are ¼ the device channel W/L ratios of the transistors 328 and 332. With these example values, any of various different phase shifts can be realized. For instance, if the select transistors 906, 910, 922 and 924 are turned off, and the select transistors 908 and 920 are turned on, the phase shift would be (⅓−¼)*360°=30°. Alternatively say the select transistors 910, 922 and 924 are turned off, and the select transistors 906, 908 and 920 are turned on, the phase shift would be ((⅓+¼)−¼)*360°=120°. It will be understood that although in the above example, each of the sourcing transistors has different ratios to accommodate phase shift adjustments that can either be quite fine or more coarse, in other examples the sourcing transistors could each have the same ratio.

As will be appreciated by those skilled in the art, a system that includes the charge pump 900 can also include a main controller having registers that provide the enable signals for controlling which of the select transistors 906, 908, 910, 920, 922 and 924 are made conducting or non-conducting. In particular, each of the enable signals from such main controller registers would be applied to one of the gates 936, 940, 942, 946, 948 and 950.

If the charge pump 900 is designed into a PLL then, as will be appreciated by those skilled in the art, a resistor, such as illustrated resistor 988, is typically added in series with the capacitor 340. By contrast, if the charge pump 900 is designed into a DLL, then the resistor 988 would be absent.

Figure 10:
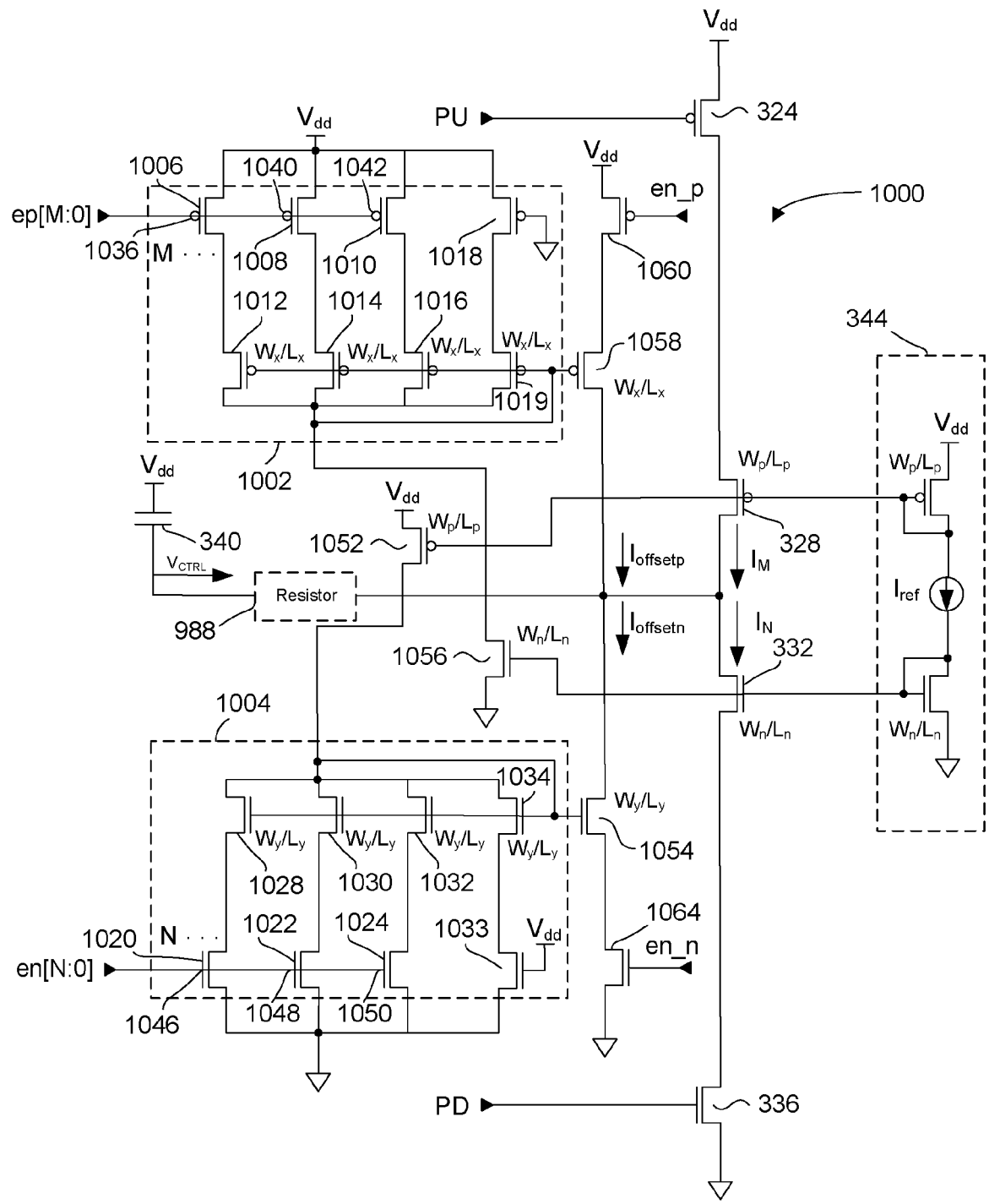
FIG. 10 is a circuit schematic of a charge pump in accordance with yet another example embodiment.

FIG. 10 is a circuit schematic of a charge pump 1000 in accordance with yet another example embodiment. This circuit provides offset currents which can be independently applied to currents $I_M$ and $I_N$, and which will typically be continuously generated. The circuit embodiment of FIG. 9 has first and second programmable array of transistors connected directly to sourcing transistor 328 and sinking transistor 332, thereby directly generating the offset currents. The circuit of the present embodiment on the other hand uses its first and second programmable array of transistors to control an offset generator circuit for generating the offset currents. The operations of the sourcing transistor 328, the sinking transistor 332, the current mirror 344 and the switching transistors 324 and 336 have been previously described, and hence it is unnecessary to repeat what has been previously described in detail. In at least one example, the PU and PD signals applied at the gates of the switching transistors 324 and 336 are generated by a PFD of the type described in the previously referred to Roland E. Best reference.

With reference to the source portion of the charge pump 1000, there is a supplemental source circuit that in the illustrated example embodiment comprises a programmable array of transistors 1002, a bias transistor 1056, a current source transistor 1058, and transistor 1060. The illustrated programmable array of transistors 1002 includes M+1 pairs of PMOS transistors, with transistors of each pair being connected in series. Each of select transistors 1006, 1008 and 1010 have their drains coupled to $V_{dd}$ and their sources electrically connected to the drains of one of gate-drain-connected transistors 1012, 1014 and 1016. As before, while in some examples each of the gate-drain connected transistors will have the same ratios, in other examples, each of the gate-drain connected transistors will have a different ratio. An additional pair of PMOS transistors 1018, 1019 is provided to prevent deviation from the calibrated offset current (under certain conditions) as will be explained subsequently.

With reference to the sink portion of the charge pump 1000, there is a supplemental sink circuit that in the illustrated example embodiment comprises a programmable array of transistors 1004, a bias transistor 1052, a current sink transistor 1054, and transistor 1064. The illustrated programmable array of transistors 1004 includes N+1 pairs of NMOS transistors, with transistors of each pair being connected in series. Each of select transistors 1020, 1022 and 1024 has a drain coupled to ground potential and its source coupled to one of the drains of gate-drain connected transistors 1028, 1030 and 1032. An additional pair of NMOS transistors 1033, 1034 is provided to prevent deviation from calibrated offset current (under certain conditions) as will be explained subsequently.

The array of transistors 1002 in the source portion of the illustrated charge pump 1000 is provided for setting offset current $I_{OFFSETP}$. Also, it will be understood, as explained subsequently in more detail, that the circuitry for controlling the sourcing of current through sourcing transistor 1058 comprises the array of transistors 1002. The array of transistors 1004 in the sink portion of the illustrated charge pump 1000 is provided for setting offset current $I_{OFFSETN}$. Also, it will be understood that, as explained subsequently in more detail, the circuitry for controlling the sinking of current through sinking transistor 1054 comprises the array of transistors 1004.

In the illustrated example, transistor 1052, which is in a current mirror relationship with the PMOS FET of $I_{ref}$ has the same device channel W/L ratio as the FET 328 and the PMOS FET of $I_{ref}$. Also, each of the gate-drain connected transistors 1028, 1030 and 1032 has the same device channel W/L ratio as the sinking transistor 1054, and the sinking transistor 1054 is in a current mirror relationship with the array of transistors 1004 so that the sinking of current through the sinking transistor 1054 is controlled by the array of transistors 1004. Furthermore, with device channel W/L ratios having relative values as mentioned above, the magnitude of $I_{OFFSETN}$ is roughly equal to $$\frac{1}{H+1} * I_{ref}$$

(where H is the number of select transistors in the array of transistors 1004 that are turned on, and H being any whole number less than or equal to N, the total number of select transistors in the array of transistors 1004). Those skilled in the art will appreciate the impact(s) of changing the relative device channel W/L ratios. For example, with all other factors remaining the same, a percentage increase/decrease in the device channel W/L ratio of the transistor 1052 will result in a correspondingly equal percentage increase/decease in the magnitude of $I_{OFFSETN}$.

In the illustrated example, transistor 1056, which is in a current mirror relationship with the NMOS FET of $I_{ref}$ has the same device channel W/L ratio as the FET 332 and the NMOS FET of $I_{ref}$. Also, each of the gate-drain connected transistors 1012, 1014 and 1016 has the same device channel W/L ratio as the sourcing transistor 1058, and the sourcing transistor 1058 is in a current mirror relationship with the array of transistors 1002 so that the sourcing of current through the sourcing transistor 1058 is controlled by the array of transistors 1002. Furthermore, with relative device channel W/L ratios having relative values as mentioned above, the magnitude of $I_{OFFSETP}$ is roughly equal to $$\frac{1}{G+1} * I_{ref}$$

(where G is the number of select transistors in the array of transistors 1002 that are turned on, and G being any whole number less than or equal to M, the total number of select transistors in the array of transistors 1002). Those skilled in the art will appreciate the impact(s) of changing the relative device channel W/L ratios. For example, with all other factors remaining the same, a percentage increase/decrease in the device channel W/L ratio of the transistor 1056 will result in a correspondingly equal percentage increase/decease in the magnitude of $I_{OFFSETP}$.

As previously explained in connection with FIG. 9, the phase shift in the illustrated charge pump 1000 is equal to the difference between $I_{OFFSETP}$ and $I_{OFFSETN}$ multiplied by 360 and divided by $I_M$. Substituting for the previously defined variables G and H, it will be seen that the phase shift can be expressed as follows:

$$360 * \left( \frac{1}{G+1} - \frac{1}{H+1} \right).$$

Thus, in operation, $I_{OFFSETP}$ in the source portion of the charge pump 1000 can be increased or decreased by turning on or turning off one or more of the select transistors 1006, 1008 and 1010. The select transistors 1006, 1008 and 1010 are turned on by applying a logic low signal at their respective gates 1036, 1040 and 1042 via control signals ep[M:0]. Similarly, $I_{OFFSETN}$ in the sink portion of the charge pump 1000 can be increased or decreased by turning on or turning off one or more of the select transistors 1020, 1022 and 1024. The select transistors 1020, 1022 and 1024 are turned on when a logic high signal is applied to their respective gates 1046, 1048 and 1050 via control signals en[N:0].

As will be appreciated by those skilled in the art, a system that includes the charge pump 1000 can also include a main controller having registers that provide the enable signals for controlling which of the select transistors 1006, 1008, 1010, 1020, 1022 and 1024 are made conducting or non-conducting. In particular, each of the enable signals from such main controller registers would be applied to one of the gates 1036, 1040, 1042, 1046, 1048 and 1050.

The offset generator includes transistors 1060, 1064, 1058 and 1054, where additional enable signals en_p and en_n are applied to transistors 1060 and 1064 respectively. Under conditions where no select transistors in the array of transistors 1002 are turned on, en_p will be set to an inactive logic level (which is logic high in the illustrated example) and the transistors 1018, 1019 and 1060 will help ensure deviation from calibrated offset current is avoided. For example, the voltage at the node to which the drain of the bias transistor 1056 is connected will not be allowed to float. Similarly under conditions where no select transistors in the array of transistors 1004 are turned on, en_n will be set to an inactive logic level (which is logic low in the illustrated example) and the transistors 1033, 1034 and 1064 will help ensure deviation from calibrated offset current is avoided. For example, the voltage at the node to which the drain of the bias transistor 1052 is connected will not be allowed to float.

It will be understood that in those instances where M and N are greater than 1, few transistors are directly connected to the $V_{CTRL}$ node of the charge pump 1000 as compared to the $V_{CTRL}$ node of the charge pump 900. As a result, the $V_{CTRL}$ node of charge pump 1000 has less capacitance loading as compared to the charge pump 900. Also, if the charge pump 1000 is designed into a PLL then, as will be appreciated by those skilled in the art, a resistor, such as the illustrated resistor 988, is typically added in series with the capacitor 340. By contrast, if the charge pump 1000 is designed into a DLL, then the resistor 988 would be absent.

A number of circuits and methods for scaling of charge pump currents in order to make fine-tuned adjustments in phase shifting have been described and illustrated. It will be apparent that these circuits and methods can be modified by one skilled in the art, and in so doing other circuits and methods can be realized which share at least some non-trivial similarities to the charge pump current scaling circuits and methods described herein. For example, one could incorporate circuitry into a charge pump that would continually cause an offset current to be sourced/added into and/or sunk/removed from the capacitor 340 regardless of the logic levels of the PU and PD control signals. Such an implementation would, in some examples, be less energy efficient than implementations previously described in this disclosure. It should be noted that capacitor 340 shown in the embodiments of the invention shown in FIGS. 7 and 8 can be a passive component of the loop filter, or alternately, capacitor 340 can be a component of charge pumps 700 and 800.

It will be understood that adjustments in phase shifting in accordance with example embodiments could be carried out, for example, during testing/calibration and/or dynamically.

Certain adaptations and modifications of the described embodiments can be made. Therefore, the above discussed embodiments are considered to be illustrative and not restrictive.

What is claimed is:

1. A charge pump circuit comprising:
    a capacitor connected in parallel to an output node;
    a reference current source generating a reference current;
    a primary current switching circuit for charging said capacitor with a source current and for discharging said capacitor with a sink current, said source current tracking the reference current and said sink current tracking the reference current;
    a supplemental source circuit including an offset generator for sourcing, in response to a bias voltage, a positive phase shift producing current having a range of magnitudes, the supplemental source circuit also including a programmable array of transistors for providing the bias voltage, the bias voltage being adjustable in response to at least one source selection signal, said positive phase shift producing current tracking the same current tracked by said source current; and
    a supplemental sink circuit for sourcing a negative phase shift producing current having a range of magnitudes, a magnitude of the negative phase shift producing current being determined by at least one sink selection signal, said negative phase shift producing current tracking the same current tracked by said sink current.

2. The charge pump circuit of claim 1, wherein the supplemental source circuit includes pairs of select transistors and sourcing transistors connected in series, each of the pairs adjusting the magnitude of the positive phase shift producing current in response to the at least one source selection signal.

3. The charge pump circuit of claim 1, wherein the supplemental sink circuit includes pairs of select transistors and sinking transistors connected in series, each of the pairs adjusting the magnitude of the negative phase shift producing current in response to the at least one sink selection signal.

4. The charge pump circuit of claim 1, wherein the programmable array of transistors includes pairs of select transistors and sourcing transistors connected in series, each of the pairs adjusting the bias voltage in response to the at least one source selection signal.

5. The charge pump circuit of claim 4, wherein the offset generator includes a current source transistor having a gate for receiving the bias voltage.

6. The charge pump circuit of claim 5, wherein the offset generator includes an enable transistor for coupling a voltage supply to the current source transistor in response to an enable signal.

7. The charge pump circuit of claim 5, wherein each of the sourcing transistors are diode connected and in a current mirror configuration with the current source transistor.

8. The charge pump circuit of claim 5, wherein the supplemental source circuit includes a bias transistor connected between the gate of the current source transistor and a voltage supply, the bias transistor sinking current that tracks the reference current.

9. The charge pump circuit of claim 1, wherein the offset generator is a first offset generator, the programmable array is a first programmable array, the bias voltage is a first bias voltage, and the supplemental sink circuit includes
- a second offset generator for sinking the negative phase shift producing current in response to a second bias voltage,
- second programmable array of transistors for providing the second bias voltage, the second bias voltage being adjustable in response to the at least one sink selection signal.

10. The charge pump circuit of claim 9, wherein the second programmable array of transistors includes pairs of select transistors and sinking transistors connected in series, each of the pairs adjusting the second bias voltage in response to the at least one sink selection signal.

11. The charge pump circuit of claim 10, wherein the second offset generator includes a current sink transistor having a gate for receiving the second bias voltage.

12. The charge pump circuit of claim 11, wherein the second offset generator includes an enable transistor for coupling a voltage supply to the current sink transistor in response to an enable signal.

13. The charge pump circuit of claim 11, wherein each of the sinking transistors are diode connected and in a current mirror configuration with the current sink transistor.

14. The charge pump circuit of claim 11, wherein the supplemental sink circuit includes a bias transistor connected between the gate of the current sink transistor and a voltage supply, the bias transistor sourcing current that tracks the reference current.

15. A charge pump circuit comprising:
- a capacitor connected in parallel to an output node;
- a reference current source generating a reference current;
- a primary current switching circuit for charging said capacitor with a source current and for discharging said capacitor with a sink current, said source current tracking the reference current and said sink current tracking the reference current;
- a supplemental source circuit for sourcing a positive phase shift producing current having a range of magnitudes, a magnitude of the positive phase shift producing current being determined by at least one source selection signal, said positive phase shift producing current tracking the same current tracked by said source current; and
- a supplemental sink circuit having an offset generator for sourcing a negative phase shift producing current having a range of magnitudes in response to a bias voltage, and a programmable array of transistors for providing the bias voltage, said negative phase shift producing current tracking the same current tracked by said sink current.

16. The charge pump circuit of claim 15, wherein the offset generator is a first offset generator, the programmable array is a first programmable array, the bias voltage is a first bias voltage, and the supplemental source circuit includes
- a second offset generator for sourcing the positive phase shift producing current in response to a second bias voltage,
- second programmable array of transistors for providing the second bias voltage, the second bias voltage being adjustable in response to the at least one source selection signal.

17. The charge pump circuit of claim 16, wherein the second programmable array of transistors includes pairs of select transistors and sourcing transistors connected in series, each of the pairs adjusting the second bias voltage in response to the at least one source selection signal.

18. The charge pump circuit of claim 17, wherein the second offset generator includes a current source transistor having a gate for receiving the second bias voltage.

* * * * *